US012787521B2

(12) United States Patent
Frei

(10) Patent No.: US 12,787,521 B2
(45) Date of Patent: Nov. 3, 2026

(54) OPTOELECTRONIC COMPONENT, LUMINESCENT ASSEMBLY AND MOUNTING STRAP

(71) Applicant: ams-OSRAM International GmbH, Regensburg (DE)

(72) Inventor: Ulrich Frei, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 627 days.

(21) Appl. No.: 18/267,414

(22) PCT Filed: Dec. 10, 2021

(86) PCT No.: PCT/EP2021/085299
§ 371 (c)(1),
(2) Date: Jun. 14, 2023

(87) PCT Pub. No.: WO2022/128820
PCT Pub. Date: Jun. 23, 2022

(65) Prior Publication Data
US 2024/0063355 A1 Feb. 22, 2024

(30) Foreign Application Priority Data
Dec. 14, 2020 (DE) ..................... 10 2020 133 315.3

(51) Int. Cl.
*H10H 20/857* (2025.01)
*H10H 20/85* (2025.01)
*H10W 90/00* (2026.01)

(52) U.S. Cl.
CPC ...... *H10H 20/857* (2025.01); *H10H 20/8506* (2025.01); *H10W 90/00* (2026.01)

(58) Field of Classification Search
CPC ............ H10H 20/8506; H10H 20/857; H10H 20/0364; H01L 25/167; H01L 2224/48247; H10W 90/00
See application file for complete search history.

(56) References Cited

U.S. PATENT DOCUMENTS

2014/0312378 A1* 10/2014 Hsue ..................... H10H 29/10 438/23
2016/0149088 A1 5/2016 Yan et al.
2020/0224847 A1* 7/2020 Li .......................... F21S 43/14

FOREIGN PATENT DOCUMENTS

DE 202004014555 U1 2/2006
DE 102008049777 A1 11/2009
(Continued)

OTHER PUBLICATIONS

International Search Report and Written Opinion issued in corresponding International Application No. PCT/EP2021/085299 dated Apr. 12, 2022.

*Primary Examiner* — Antonio B Crite
(74) *Attorney, Agent, or Firm* — ArentFox Schiff LLP

(57) ABSTRACT

The invention relates to an optoelectronic device comprising an encapsulated housing having a radiation region and an integrated control chip. At least one optoelectronic component integrated into the radiation region is provided, which is coupled to the integrated control chip for electrical control. A plurality of contact areas on at least one side of the encapsulated housing are partially electrically connected to the integrated control chip. At least a first and a second contact region of the plurality of contact regions are electrically connected to the integrated control chip and are each adapted to be electrically connected to an optoelectronic component disposed outside the housing. A first group of contact areas is adapted to receive control signals to the integrated control chip. A second group of contact areas has
(Continued)

one contact area for a ground connection and one contact area for connecting a supply voltage for the integrated control chip.

21 Claims, 3 Drawing Sheets

(56) References Cited

FOREIGN PATENT DOCUMENTS

| | | | |
|---|---|---|---|
| DE | 102019104436 | A1 | 8/2020 |
| EP | 2175696 | A2 | 4/2010 |

* cited by examiner

OPTOELECTRONIC COMPONENT, LUMINESCENT ASSEMBLY AND MOUNTING STRAP

The present application is a 35 U.S.C. § 371 National Phase of PCT Application No. PCT/EP2021/085299, filed Dec. 10, 2021, which claims the priority of German patent application DE 10 2020 133 315.3 dated Dec. 14, 2020, the disclosures content of which are hereby incorporated by reference in their entirety The invention relates to an optoelectronic component and to a lighting arrangement comprising such a device. The invention further relates to a placement strap.

In the automotive field, but also for other fields, various functions are required for light-emitting diodes or, more generally, light-emitting arrangements with optoelectronic components and, in particular, light-emitting diodes. For example, individually controllable spatially distributed LEDs are used for indicators, displays, but also for leaving and coming-me functions as well as for adaptive headlights.

A high degree of flexibility is achieved by selectively switching them on or off while at the same time being able to adjust the brightness. Thus, not only different shapes or figures can be imaged, but also a dynamic of the light image can be realized. There are various options for providing such functionality, each of which can vary depending on the area of application. For example, so-called multi-channel drivers can be used, in which each optoelectronic component is controlled individually. A well-known and old example of such a multi-channel driver would be the 7447 device of the 74xx series from the 1960s as well as its modifications and the corresponding circuits on CMOS technology.

Alternatively, entire LED strings can be used, connected in series, with each optoelectronic component arranged in parallel to a switch, via which the optoelectronic component can be individually switched on and off. In such a case, the disadvantage would be that the voltage drop across the series changes depending on the components "switched off", so that additional measures have to be taken to prevent damage. Likewise, there are ready optoelectronic components that have their driver integrated, so that these are already programmable to a small extent.

While various implementations are thus known, there is nevertheless a need for further solutions that enable a wide range of applications.

SUMMARY OF THE INVENTION

The inventor has recognized that although the conventional solutions cover various applications, there is a relatively high circuit and wiring effort in applications, especially in the automotive sector, e.g. in the form of multilayer boards. At the same time, complex lighting solutions require increased programming effort or other implementations, so that scalability is jeopardized. An example is a rear light bar in cars, where a multitude of optoelectronic components are controlled, for example to generate running lights or other figures and shapes.

An optoelectronic component is now proposed which comprises an encapsulated housing, the housing having a radiation area. A control chip is integrated in the encapsulated housing. In turn, at least one optoelectronic component is arranged in the radiation area, which is connected to the integrated control chip. According to the invention, the device now comprises a plurality of contact areas on at least one side of the encapsulated housing, which are at least partially electrically connected to the integrated control chip. In one embodiment, the plurality of contact areas may be arranged on a side facing away from the radiation area.

At least a first and a second contact area of the plurality of contact areas is now electrically connected to the integrated control chip, respectively. The first and second contact areas are each designed to be electrically connected to an optoelectronic component arranged outside the housing.

Furthermore, the plurality of contact areas of the device according to the invention comprises a first group of contact areas which are designed to receive control signals to the integrated control chip and are connected thereto. Thereby, it can be provided to lead the control signals via a differential control signal line, which requires two contact areas per differential control signal line in the first group. Finally, a second group of contact areas is provided for the plurality of contact areas, the second group having at least one contact area for a ground connection and one contact area for connecting a supply voltage at least for the integrated control chip.

According to the proposed principle, a device is thus created, which combines the advantages of an "intelligent" light-emitting diode with a multi-channel driver. On the one hand, the device thus comprises at least one integrated optoelectronic component, whereby selective or otherwise "intelligent" or programmable control of the optoelectronic component is ensured by the likewise integrated control chip. On the other hand, the device comprises at least two connections to which further optoelectronic components can be connected, which can be controlled by the integrated control chip. This concept thus permits a flexible and scalable application, whereby both the number of integrated optoelectronic components and the number of externally controllable optoelectronic components are in principle not limited. In particular, the device can be used to form an RGB pixel, where one color is provided by the integrated optoelectronic component and the other two colors are provided by the externally arranged optoelectronic components.

This creates a master-slave arrangement, with the device forming the "master" while externally connected optoelectronic components or other devices connected to the first and second contact areas form the "slaves". Thus, the invention is in principle not limited to the connection with optoelectronic components.

The device is also designed with a first group of contact areas for the supply of programming or control signals. Thus, more complex structures and interconnections of such devices can be generated. For example, several such devices can be connected in a so-called daisy chain arrangement.

The device allows a very flexible design of the anode and cathode connections depending on the application. In one embodiment, the second group of contact regions of the plurality of contact regions comprises a contact region that is electrically connected to the at least one optoelectronic component, and in particular forms the anode connection for the at least one optoelectronic component. Alternatively, this can also be the cathode connection for the at least one (integrated) optoelectronic component. In both cases, the integrated control chip is designed to connect the respective other terminal corresponding to a contact area to the at least one optoelectronic component. Thus, the control chip is adapted to control a current through the at least one optoelectronic component. In other words, the integrated control chip may be configured to electrically connect the contact area for connecting a supply voltage to the optoelectronic component integrated in the radiation area and/or the integrated control chip is configured to electrically connect the contact area for the master connection to the optoelectronic component integrated in the radiation area.

In one embodiment, the integrated control chip is designed to electrically connect the at least one contact area for the ground connection to the at least one first and one second contact area. In this way, a common ground connection is created for all optoelectronic components that are both integrated and connected to the first and a second contact area. In a further embodiment, the integrated control chip is designed to electrically connect the contact area for connecting a supply voltage to the at least one first and one second contact area.

As mentioned above, the number of first and second contact areas is not limited. The device may thus comprise a plurality of such contact areas controllable by the integrated control chip. In this case, a "controllable" or "controllable" contact region means that the control chip is configured to regulate or adjust a current flowing through the contact region.

In one aspect, the device or alternatively the integrated control chip comprises at least three adjustable current sources, wherein a first of the three current sources is configured to adjust a current through the at least one optoelectronic component integrated into the radiating region.

A second of the at least three adjustable current sources is configured to provide a controllable current through the first contact region of the plurality of contact regions; and the third of the at least three adjustable current sources is configured to provide a controllable current through the second contact region of the plurality of contact regions.

This ensures that the device, or the control chip integrated therein, provides and also adjusts the current that supplies the integrated and externally connected components. By suitable programming of the control chip with control signals at the first group of contact areas, different switch-on and switch-off sequences and also brightness sequences can be set.

Further aspects concern additional functionalities of the integrated control chip. In one embodiment, the integrated control chip can be designed to detect a temperature or a temperature difference, in particular of the housing, and to control the at least one optoelectronic component integrated in the radiation area as a function thereof and/or to adjust the current through this component accordingly as a function of the detected temperature or the detected temperature difference. Additionally or also optionally, the control chip is designed to apply a current to the at least two optoelectronic components arranged outside the housing (50) as a function of a detected temperature or a detected temperature difference.

Furthermore, in one embodiment, the integrated control chip may comprise a memory for storing correction factors for at least the at least one optoelectronic component integrated in the radiation area. The integrated control chip is then further configured to set a current corrected with the correction factors through the at least one optoelectronic component integrated in the radiation area. In a further embodiment, the integrated control chip comprises a memory for storing correction factors for the optoelectronic components arranged outside the housing and is adapted to provide a current corrected with the correction factors for the first and second contact areas of the plurality of contact areas.

The correction factors can be stored, for example, in a so-called look-up table. The correction factors stored in the memory may have a temperature dependency, i.e. the factors are a function of temperature. Likewise, the correction factors may be material specific, and thus have manufacturing or material specific dependencies. In some aspects, the correction factors are associated with or assigned to externally located optoelectronic components. Thus, correction factors can be stored in the control chip that are dedicated to change a current through the associated device (external or the integrated). In addition, this correction factor can depend on a component-specific parameter.

With these embodiments, additional "intelligence" is introduced into the control chip so that components can be selectively driven and component-specific deviations or scatter can be compensated for.

In another aspect, the radiation area of the housing of the device comprises a transparent cover, in particular to protect against damage to the at least one optoelectronic component integrated in the radiation area. The housing can be designed as a ceramic package. Alternatively, the package may comprise a lead frame (ceramic or metallic in nature) having a central region on which the integrated control chip is mounted and having a plurality of contact fingers forming at least a portion of the plurality of contact regions.

Electrical connection between the control chip and the contact areas may be provided by bonding wires routed within the encapsulated package, which electrically connect contacts on a surface of the integrated control chip to the plurality of contact areas. In one embodiment, the plurality of contact areas are flush with a surface of the encapsulated package such that a metallic material of the plurality of contact areas is recessed within the encapsulated package. Pins or other embodiments or a combination thereof are also conceivable as con-tact areas. If a larger amount of heat has to be dissipated, individual contact areas, for example a contact area for the ground connection, can be designed with a large surface area so that it also serves as a heat sink.

The proposed device can be part of a lighting arrangement in which other optoelectronic components are provided in addition to the device. Thus, in some aspects, a lighting arrangement is disclosed comprising a proposed device and a first external component and a second external component. The first external optoelectronic component is connected to the first contact region of the plurality of contact regions and to a potential tap. The second external optoelectronic component is connected to the second contact area of the plurality of contact areas and to the potential tap.

The light emitting arrangement can be used, among other things, to generate different colors. For this purpose, in some aspects it is provided that the at least one optoelectronic component integrated in the radiation area, the first external optoelectronic component as well as the second external optoelectronic component are designed for generating light in different colors, in particular in the colors red, green and blue.

A further aspect relates to a simplified processing that is particularly suitable for automation. Thus, the first and/or the second external optoelectronic component may be integrated in a housing with a radiation area having the same dimensions as the encapsulated housing. In other words, the light emitting device comprises several housings with the same form factor and similar or identical design, one of which houses the integrated control chip and at least one optoelectronic component, while the other housings only contain optoelectronic components and their connections.

Thus, in one embodiment, the packages in which no control chip is integrated have a smaller number of contact areas than the encapsulated package, in particular do not include first and second contact areas and/or integrated control chip. The housings can generally be manufactured in the same way, for example by means of a molding process.

Another aspect relates to the manufacture of a light emitting device. For this purpose, usually a mechanical, i.e. automatic, assembly of a printed circuit board is carried out by a corresponding robot. For this purpose, the robot must select, remove and place on the board both a master, i.e. a device with an integrated chip, and one or more slaves, i.e. merely a housing with one or more optoelectronic components. Accordingly, a placement strap with a plurality of recesses is proposed, in which a device according to the above proposed principle is arranged in a first recess. Adjacent to this first recess, at least one further recess is provided in which a housing with the first external optoelectronic component is arranged, the housing having substantially the same dimensions as the encapsulated housing of the device. In other words, both master device and slave housings are thus provided in the same harness.

In one aspect, three successive wells are provided, each containing the device as well as the housings containing the first external optoelectronic component as well as the second external optoelectronic component. In one aspect, for correct removal and avoidance of placement errors, a mark is provided on the placement strap that has a defined relationship to the cavity in which the device is provided.

BRIEF DESCRIPTION OF THE DRAWINGS

Further aspects and embodiments according to the proposed principle will become apparent with reference to the various embodiments and examples described in detail in connection with the accompanying drawings.

DETAILED DESCRIPTION

The following embodiments and examples illustrate various aspects and their combinations according to the proposed principle. The embodiments and examples are not always to scale. Likewise, various elements may be shown enlarged or reduced in size to emphasize individual aspects. It goes without saying that the individual aspects and features of the embodiments and examples shown in the figures can be readily combined with each other without affecting the principle of the invention. Some aspects have a regular structure or shape. It should be noted that minor deviations from the ideal shape may occur in practice, but without contradicting the inventive idea.

In addition, the individual figures, features and aspects are not necessarily shown in the correct size, nor do the proportions between the individual elements have to be fundamentally correct. Some aspects and features are emphasized by showing them enlarged. However, terms such as "above", "above", "below", "below-half", "larger", "smaller" and the like are correctly represented in relation to the elements in the figures. Thus, it is possible to derive such relationships between the elements based on the figures.

Figure 1A:
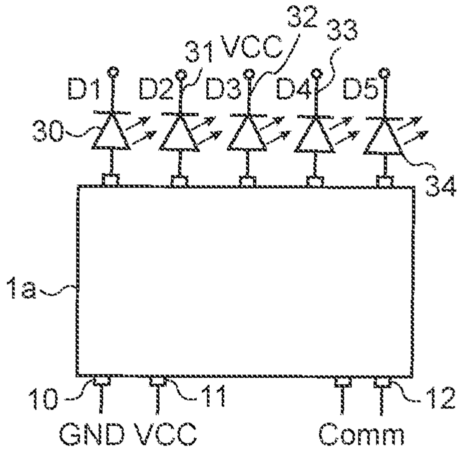
FIGS. 1A and 1B show two schematic embodiments for drivers for driving optoelectronic components.
Figure 1B:
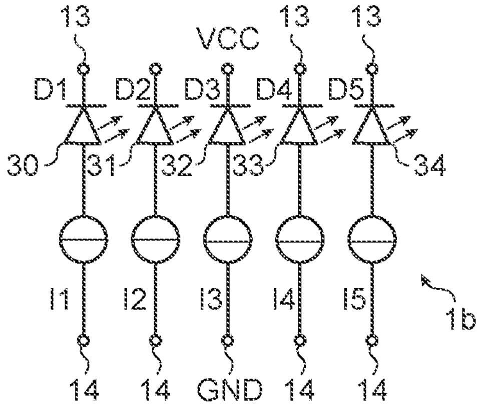

FIGS. 1A and 1B show embodiments of conventional driver circuits for driving optoelectronic components and light-emitting diodes, respectively. FIG. 1A shows a so-called multichannel driver, which is designed, for example, to control and supply power to a total of five light-emitting diodes. The multi-channel driver 1*a* is provided in a housing as an integrated chip and comprises a ground connection 10, a supply potential connection 11 and a data input 12 for programming and control. A supply voltage for supplying the multichannel driver 1*a* is applied to the supply connection 11. On the output side, several diodes 30 to 34 are now connected to the multichannel driver. In this embodiment, the anode of each diode 30 to 34 is connected to a terminal for a second supply potential and the cathode is connected to the multichannel driver 1*a*.

An alternative embodiment is shown in FIG. 1B, in which a controllable current source is connected in the current path of each associated diode 30 to 34. The controllable current source is thus connected between the ground potential connection 14 and the cathode of the respective diode. The controllable current sources are controlled individually so that they can be used to adjust both the switch-on and switch-off behavior of each associated diode and the brightness. In contrast to the multichannel driver of FIG. 1A, where the respective drive current sources are integrated in the multichannel driver, the design of FIG. 1B can be scaled in any way. However, the embodiment of FIG. 1B requires more complicated wiring, is more extensive and costly to program, and may require more space.

Figure 2:
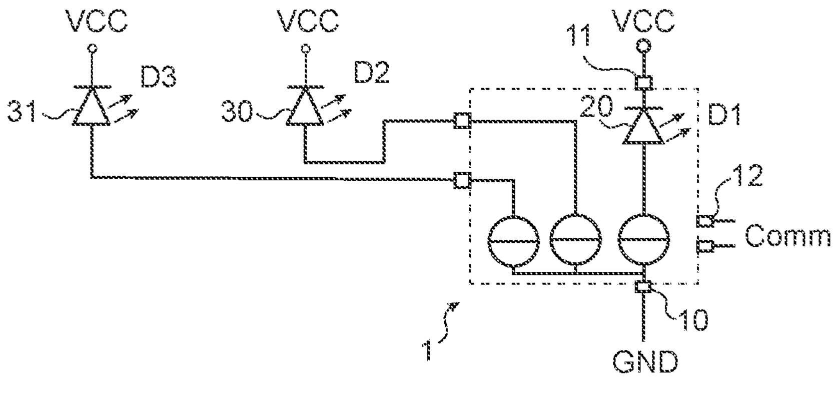
FIG. 2 illustrates an embodiment that realizes some aspects of the proposed principle.

The inventor now proposes to combine the advantages of a multi-channel driver with the simpler scalability in the case of a single drive. FIG. 2 shows an embodiment of the device according to the invention. The device 1 comprises a housing in which both an optoelectronic component and an integrated control chip (not shown here) with several controllable driver circuits and current sources are arranged. The current sources are represented by circles similar to those shown in FIG. 1B.

The individual components are housed in the housing of the device and electrically connected with contact surfaces on the surface of the housing. The housing of the device comprises a ground terminal 10, one or more data terminals 12 and a supply terminal 11 for the supply potential VCC. Also not shown in this embodiment is a supply terminal for powering the integrated control chip. However, power can also be supplied to the integrated control chip via the supply connection 11. The supply connection 11 can thus be designed as a voltage supply connection for the diode 20 as well as for the voltage supply of the control chip. According to the invention, the housing of the device now comprises further connections on the top side, which are led inside the housing to the further power sources of the integrated control chip. The further connections are designed in such a way that they can be connected to external optoelectronic components. In the embodiment example of FIG. 2, these would be the diodes 30 and 31, whose cathode-side connections are connected to the contact surfaces on the surface of the housing of the device 1 according to the invention. The anodes of the respective optoelectronic components are also connected to the common supply potential VCC.

This creates a device, which has one or more integrated optoelectronic components 20, whereby the device according to the invention can be operated as a programmable and controllable illuminant even without further components. In addition, however, it comprises a multiplicity of further contact surfaces or pins which serve for the connection of further externally arranged optoelectronic components. The control and the provision of the necessary supply current is carried out by the device according to the invention and in particular by the integrated control chip arranged therein. In this way, a multi-channel driver can be realized which, on the one hand, comprises one or more integrated optoelectronic components so that this multi-channel driver can also be operated without further light-emitting diodes. On the other hand, it can also serve as a classic multichannel driver.

According to the invention, it is thus possible to operate the device, for example, as an RGB pixel, whereby one color is provided by the integrated light-emitting diode 20 and the other two colors are provided by the externally arranged light-emitting diodes. By the programming work of the device and the resulting selective control of the individual optoelectronic components, each color can thus be generated in different brightness and intensity.

In addition, the control chip integrated in the device 1 may have further functionalities. For example, it is possible to provide within the integrated device a temperature sensor, not shown here, whose temperature is detected and evaluated by the integrated control chip. In this way, a temperature-dependent component of the current can be corrected by the integrated optoelectronic component as well as by the externally arranged optoelectronic components.

Figure 3:
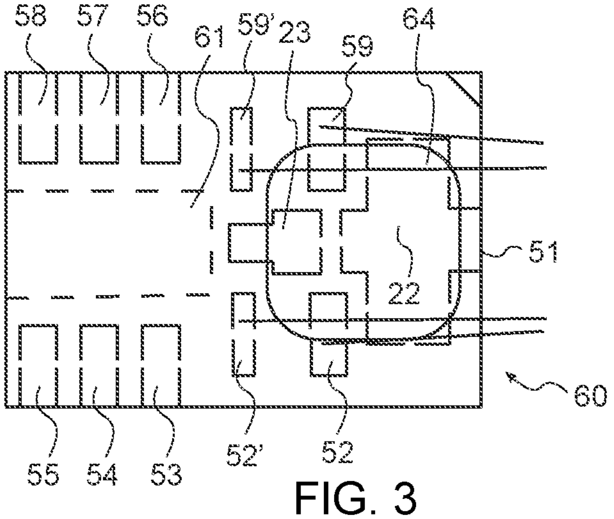
FIG. 3 shows a pin layout view of a device according to the proposed principle.

FIG. 3 shows a layout of a device according to the proposed principle in plan view without their respective equipment with an integrated control chip and optoelectronic components. The device can be realized in different standardized package forms (e.g. DFP, QFP, SOIC, QFN and others), which allows an easy implementation into already existing solutions. Likewise, the use of existing and standardized package forms allows a simple design for such applications.

The pin layout of the device according to the invention comprises several contact areas 53 to 58, which serve to supply a supply current or a supply voltage and to supply various control signals for programming the integrated control chip. For example, contact area 53 forms a driver supply pin for supplying a supply current and a supply voltage to the integrated control chip. Contact areas 54 and 55 are provided as data connection pins so that a differential control signal can be applied to the integrated control chip there. In this embodiment, the control signal is a digital data word. Depending on the design, a so-called daisy chain circuit can be used here, so that a differential signal applied to these contact areas is looped through and made available again at contact areas 56 and 57.

Contact area 58 is provided for a control word for programming, for example, so that the integrated control chip can be programmed depending on this. This makes it possible, for example, to program the integrated control chip via the contact areas 54 and 55 for the control signals and, for example, to store correction values or other parameters in a memory of the integrated control chip. Various protocols are suitable for programming.

The larger contact area 61 forms a common ground connection for the integrated control chip as well as for the integrated optoelectronic components of the device and the externally arranged components. The integrated control chip is placed on the contact area 61 for this purpose. The design of the contact surface 61 as a large-area metallic ground connection also forms a heat sink, so that the heat generated by the driver circuits inside the integrated control chip can be dissipated via this large-area ground connection 61.

Finally, the pin layout of the device according to the invention comprises further contact areas 52 and 52' or 59 and 59'. These serve to connect externally arranged optoelectronic components and to provide corresponding supply signals to these components. A contact pad 23 within the layout forms the cathode-side connection for the integrated optoelectronic component(s), which is applied to the area 22. The area 64 provides a transparent viewing window so that light generated by the optoelectronic component can be emitted through it. Finally, in this embodiment, the contact area 51 is provided as a supply terminal for supplying a supply voltage for the optoelectronic component in the area 22.

Figure 4:
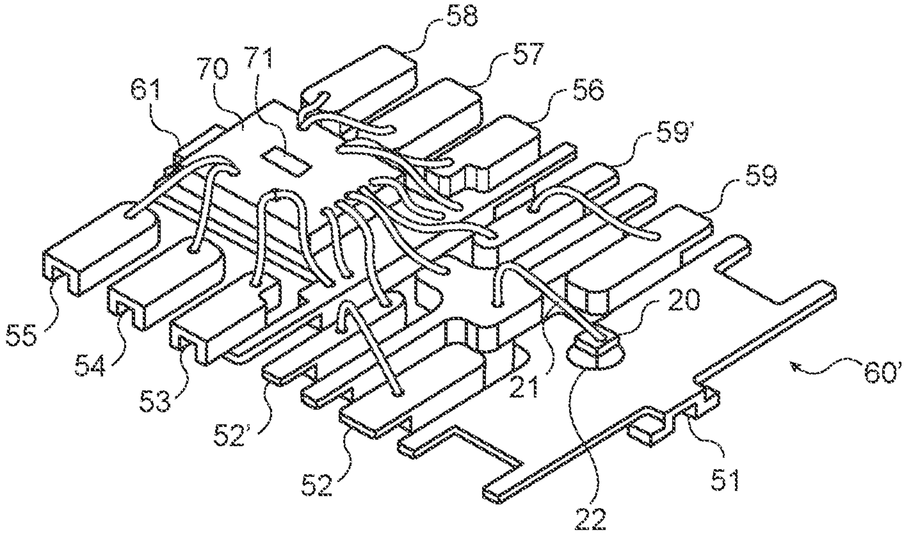
FIG. 4 is a perspective view showing some aspects of the proposed principle.

FIG. 4 shows a frame layout of the device according to the proposed principle. Shown here is a metallic lead frame with several contact fingers, which form the contact areas encapsulated in a housing. The lead frame comprises a metallic structure, whereby the individual contact fingers are electrically connected to the control chip or the optoelectronic component 20 or to each other by bonding wires. The integrated control chip 70 is mounted on the area 61 and includes on its underside (not shown here) an electrical contact to the common ground connection 61. At the same time, as already mentioned, this area serves as a heat sink. The integrated chip 70 comprises a memory area 71 in which correction values or other parameters for the operation of the device according to the invention are stored. On its surface, the control chip comprises a plurality of contact pads which are connected to the corresponding con-tact areas of the lead frame via bonding wires. The contact areas themselves are in turn electrically isolated from the ground connection.

Specifically, the contact areas 53 to 55 are led to the surface and the contact pads on the integrated control chip 70 via respective bonding wires. Also, the contact areas 56 to 58 are electrically connected to the contact pads on the integrated control chip 70 via bonding wires. The optoelectronic component is applied to a metallic area of the lead frame, which also simultaneously forms the contact area and diode connection 51. In this embodiment, the component 20 is designed as a so-called vertical light-emitting diode, with the cathode-side connection of the optoelectronic component 20 being oriented upwards and connected to an area of the lead frame via a bonding wire 21.

This area is connected to the integrated control chip via a further bonding wire. This embodiment was chosen for design reasons in order to limit the bonding wire to a maximum predetermined length. In other embodiments, the design with integrated control chip and optoelectronic component can also be more compact.

The contact areas 52 and 52' as well as 59 and 59' are electrically connected to each other by bonding wires. In other words, the same potential is applied to them, whereby several externally arranged components can be connected to the contact areas. This can be useful, for example, in a symmetrical design of a lighting arrangement with several externally arranged light-emitting diodes, since the wiring length can be selected to be short.

In addition, each area 52' or 59' is also connected to the integrated control chip via a further bonding wire for controllably supplying the external components. For the manufacture of the device according to the invention, this lead frame is encapsulated in a housing so that the intermediate areas between the individual contact areas are filled with an insulating material, for example plastic. The areas of the lead frame that can form the subsequent contact areas already have the desired shape for the contact fingers, as shown.

In addition to the lead frame design shown here, the device according to the invention can also be implemented with a ceramic package or in other ways.

Figure 5:
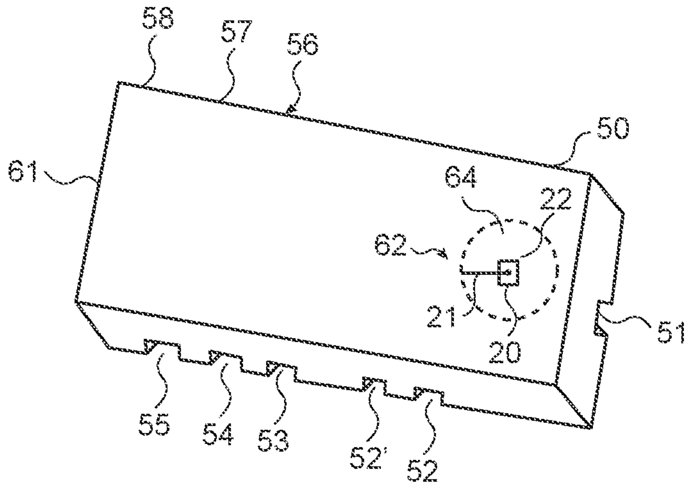
FIG. 5 is an embodiment of a device showing further aspects of the proposed principle.

FIG. 5 now shows a perspective view of a device according to the invention with a housing 50 in which the integrated control chip and the optoelectronic component 20 are integrated. This device with an integrated control chip and an optoelectronic component is also referred to as a master device, since it can also control other optoelectronic components (or other components) in addition to the integrated optoelectronic component, which are referred to below as slave devices.

Here, the integrated control chip 70 is completely surrounded by the plastic material of the housing 50. A radiation area 62 in the form of a viewing window 64 is provided in the housing 50, the position of which corresponds to the element 64 of FIG. 3 and in the center of which the integrated optoelectronic component 20 is arranged. Also visible is the bonding wire 21, which extends from the upper side of the optoelectronic component to a contact pad, which is no longer shown here and lies outside the viewing window 54. The viewing window 64 includes a transparent material that transmits light emitted from the optoelectronic component and also provides protection from damage to the optoelectronic component 20. In addition to the single integrated optoelectronic component shown here, it is also possible to provide multiple optoelectronic components in the recess. Likewise, the package may be provided with further optoelectronic component recesses at different positions on the housing 50. Depending on the design and configuration, the device thus comprises several and differently arranged recesses in which optoelectronic components in the form of 5 light-emitting diodes are integrated. In this respect, the device shown in FIG. 5 already forms a multichannel driver with its housing, whereby the various optoelectronic components are integrated there in the housing.

On the side of the housing 50 opposite the recess, various contact areas are now arranged as shown. The contact areas 52, 52' and 53 to 55 as well as the contact area 51 are designed with a U-shaped course, i.e. they form small recesses on the underside of the housing 50, the edges of which are formed by the material of the lead frame. The other contacts not shown are formed in the same way. In other words, the contact areas of the device according to the present invention are formed by metallized recesses or trenches. The depth of these trenches and recesses can be a few tens to a few 100 μm, depending on the size of the housing. They serve to ensure that the surface is as planar as possible when positioning and soldering the device according to the invention to the housing 50 on a printed circuit board. The solder material fills the depressions or is drawn into these depressions by capillary effects. In addition to these with metallized recesses, classic contacts such as those in the QFN package can also be provided as planar contact pads. Likewise, the device can be formed with the contact pins known from the various standardized packages.

In this case, the number of contact areas depends essentially on the functionality of the integrated control chip. In some embodiments, the integrated control chip is designed with a programming or data interface, so-that several such devices can be connected and programmed in series by means of a so-called daisy-chain arrangement.

On the other hand, the device according to the invention also allows the integrated control chip to be omitted and only the optoelectronic component 20 to be connected to the respective contact area. Such a design without a control chip, but with one or more optoelectronic components in a housing, is referred to as a slave device. Here, the form factor and the dimension of the housing are selected in such a way that both the integrated control chip and the optoelectronic component as well as only the optoelectronic component can be integrated in the same housing. This allows the same housing to be used both as a master device and as a slave device. The term master is understood to mean the device according to the invention in which both integrated optoelectronic components and the control chip are accommodated in one housing, whereby the latter can also control further externally arranged optoelectronic components. In a slave device, on the other hand, only one or more optoelectronic components are accommodated, which are controlled by the master. Several of these masters can be individually programmed and controlled via a data interface. Each individual master in turn controls the slaves that are externally connected and assigned to it.

Figure 6:
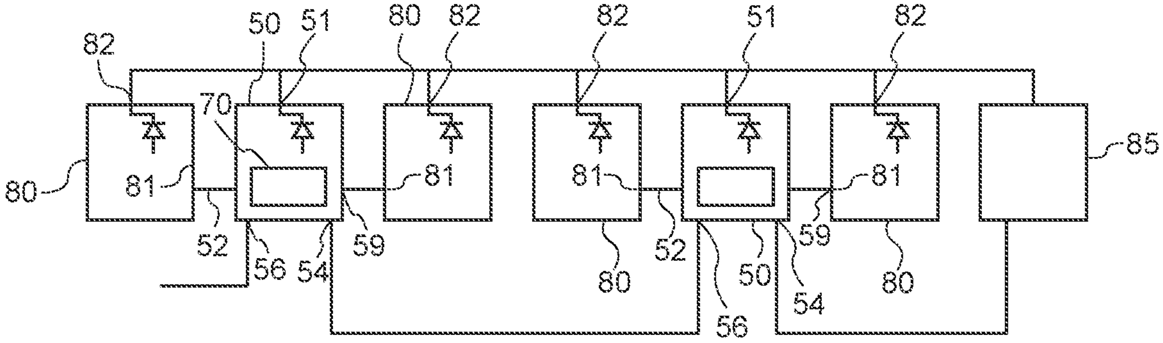
FIG. 6 is an embodiment with two devices according to the principle of the invention, which are connected in a daisy-chain arrangement.

FIG. 6 shows an embodiment with several lighting devices in a master and slave design, whereby several master devices are in turn connected by means of a daisy chain arrangement for joint programming. The housings of the master devices as well as the slave devices comprise the same form factor, resulting in the same dimension and housing shape. To put it simply, the master and slave devices have the same housing and housing shape. As a result, the respective dimension of the individual device is known independently of the desired functionality and can thus be taken into account in the designs. Furthermore, a simplified production of the corresponding elements is possible, since only the integrated control chip has to be omitted and the wiring has to be slightly changed.

The design shown in FIG. 6 comprises two devices 50 with integrated control chip 70, which serve as masters. Each master also controls two slaves, each with a further optoelectronic component, which are accommodated in housings 80 of the same form factor. In this case, each of these housings 80 comprises one or more light-emitting diodes or optoelectronic components integrated in a recess in the housing. In this embodiment, the housings 80 have the same shape and configuration as the housing of the device 50, with only the control chip omitted and the wiring slightly modified. This allows different manufacturing steps to be used together to create the slave devices 80 and the master devices 50, thus reducing manufacturing costs and simplifying the process. Alternatively, the slaves may be of a different design, i.e., provided in a package with a different form factor, as a chip-size package, or without a package.

The slave device 80 comprises a contact finger 82 whose position corresponds, for example, to the contact pad 51 of the master device 50 and to which the supply potential for supplying the optoelectronic components VCC is connected. A further contact pad 81 of the slave device 80 corresponds, for example, in terms of its position to the common ground connection of the master device in the housing 50. Internally, this ground connection is directly connected to the optoelectronic component or components of the slave device 80. The contact area 81 is then connected to the external output 52 of the master device or to the external output 59 of the master device.

In this embodiment, the connections for the supply potential for the slave device and the master device are thus at the same position on the housing. The same applies to the ground connection of the master and slave devices, whereby in the slave device the ground connection is now directly connected to the optoelectronic components. This allows, for example, the pin layout of the various devices to be used as uniformly as possible.

The two master devices also each comprise a data input 54 and a data output 56. The data input 54 of the first master device 50 is connected to a communication arrangement 85. The data output 56 of the first master device is connected to the data input 54 of the second master device. The data inputs are internally routed to the respective integrated control chip 70, which in turn provides the signal to the respective data output 56. An applied signal can thus simply be looped through a master device. This allows the various master devices to be connected in a daisy-chain arrangement as shown here, making it particularly easy to program the various master devices. Depending on the protocol used, the communication arrangement 85 can also selectively address the individual master devices 50 and use them to control the light programming.

The master and slave lighting arrangements shown in FIG. 6 allow the same housings to be used for each device. This simplifies assembly in a pick-and-place machine and automated fabrication and placement without sacrificing the improved flexibility and combination of individual controllable optoelectronic components and a multichannel driver.

Figure 7:
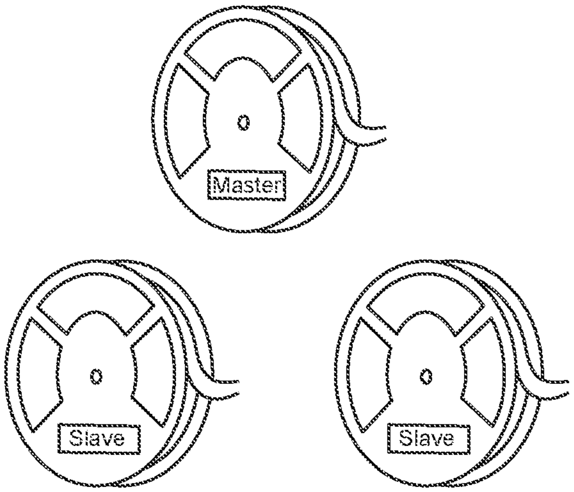
FIG. 7 shows several placement rollers, to illustrate some aspects of a lighting arrangement.
Figure 8:
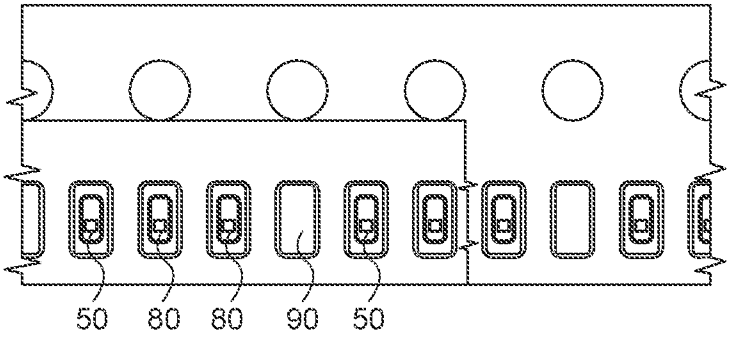
FIG. 8 is a partial section of a placement strap.

FIGS. 7 and 8 show two principal configurations suitable for mounting on boards with the lighting arrangement according to the invention. In FIG. 7, the light array is manufactured by providing the master in a single coiled placement strap. Multiple slave devices, i.e. packages with the same form factor and different optoelectronic components, can be provided with separate placement straps (referred to as slaves).

In an alternative embodiment, electronic devices with different and distinct form factors are used as slave devices. This makes it possible to provide the device of the invention as master and different electronic components with different package shapes and dimensions as slave devices in a pick-and-place machine and to assemble boards with them. In such a case, the di-mension of the device according to the invention as well as the di-mension of the externally arranged optoelectronic components in the respective packages can be selected differently.

In FIG. 8, on the other hand, the packages of both the master device and the slave device are chosen to be the same. In addition, they are arranged in a single placement strap, whereby there is a fixed connection between a master device 50 and the slave devices 80 assigned to the master device. In the example shown in FIG. 8, the individual elements are placed one behind the other in the strap in recesses, whereby each master device can additionally control two externally arranged slave devices. These are each placed in a row to the master device in recesses in the placement strap and thus form a lighting arrangement according to the proposed principle. Further light arrays are arranged in the same form in the recesses of the placement strap, whereby a marking 90 is provided between two light arrays. The marking serves to distinguish the different light arrangements from each other and to clearly identify the master device 50 of each light arrangement and the slave devices 80. This prevents incorrect use of the devices 50 or 80 and thus incorrect placement of the master device of the slave devices.

In addition, it is already possible here to store correction values for the slave devices assigned to the master device in a memory of the master device. The master can thus be completely programmed before it is loaded into the machine.

The device and lighting arrangement according to the invention thus make it possible to combine the advantages of a multichannel driver with the advantages of individually controllable optoelectronic components. The device according to the invention can be used as an intelligent light emitting diode, i.e. as a single programmable and controllable light emitting diode, but also as a master for controlling and driving further externally arranged optoelectronic components.

REFERENCE LIST

1*a* driver stage
1*b* driver stages
1 driver stage
10 ground connection
11 driver supply connection
12 data connection
13 diode supply connection
14 diode ground connection
20 integrated diode
21 bonding wire
22 contact pad
23 contact pad
30 external diode
31, 32 external diode
33, 34 external diode
50 encapsulated housing
51 contact area, common diode pin
52, 52' contact area, external pin
53 contact area, driver supply pin
54 contact area, differential data connection pin+
55 contact area, differential data connection pin−
56 contact area, differential data connection pin+
57 contact area, differential data connection pin−
58 contact area, programming pin
59, 59' contact area, external pin
60 pin layout
60' frame layout
61 common ground connection pin
62 radiation area
64 viewing window
70 control chip
71 memory
80 housing
81 supply connection
82 supply connection
85 communication arrangement
90 marker

The invention claimed is:

1. An optoelectronic device comprising:
an encapsulated housing having a radiation area;
a control chip integrated in the encapsulated housing;
at least one optoelectronic component integrated in the radiation area and coupled to the integrated control chip for electrical actuation;
a plurality of contact areas on at least one side of the encapsulated housing electrically connected at least in part to the integrated control chip;
wherein
at least a first and a second contact areas of said plurality of contact areas each being electrically connected to said integrated control chip and adapted to be electrically connected to an optoelectronic component disposed outside of said housing, respectively a first group of contact areas of said plurality of contact areas are adapted to receive control signals to said integrated control chip and are connected thereto;

a second group of contact areas of said plurality of contact areas is provided, said second group comprising at least one contact area for a ground connection, and a contact area for connecting a supply voltage at least to said integrated control chip;

the integrated control chip comprises at least three adjustable current sources, a first one of the three current sources being designed for adjusting a current through the at least one optoelectronic component integrated in the radiation area; and a second of the at least three adjustable current sources is adapted to provide a controllable current through the first contact area of the plurality of contact areas; and a third of the at least three adjustable current sources is adapted to provide a controllable current through the second contact area of the plurality of contact areas.

2. Device according to claim 1, wherein the second group of contact areas of the plurality of contact areas comprises a contact area which is electrically connected to the at least one optoelectronic component, and in particular forms an anode connection for the at least one optoelectronic component.

3. Device according to claim 1, wherein the integrated control chip is configured to electrically connect the at least one contact area for the ground connection to the at least one first and one second contact area.

4. Device according to claim 1, wherein the integrated control chip is configured to electrically connect the contact area for connecting a supply voltage to the at least one first and one second contact area.

5. Device according to claim 1, wherein the integrated control chip is configured to electrically connect the contact area for connecting a supply voltage to the optoelectronic component integrated in the radiation area and/or the integrated control chip is configured to electrically connect the contact area for the ground connection to the optoelectronic component integrated in the radiation area.

6. Device according to claim 1, wherein the integrated control chip is designed to detect a temperature or a temperature difference, in particular of the housing, and to control the at least one optoelectronic component integrated in the radiation area in response thereof; and optionally to control the at least two optoelectronic components arranged outside the housing.

7. Device according to claim 1, wherein the integrated control chip comprises a memory for storing correction factors for the optoelectronic components arranged outside the housing, and the integrated control chip is configured for providing a current corrected with the correction factors at the first and second contact areas of the plurality of contact areas.

8. Device according to claim 1, in which the radiation area comprises a transparent cover, in particular to protect against damage to the at least one optoelectronic component integrated in the radiation area.

9. Device according to claim 1, further comprising:

A lead frame having a central region on which the integrated control chip is deposited and having a plurality of contact fingers forming at least a part of a plurality of contact regions.

10. Device according to claim 1, wherein contacts on a surface of the integrated control chip are electrically connected to the plurality of contact areas via bonding wires guided in the encapsulated housing.

11. Device according to claim 1, wherein the plurality of contact areas are flush with a surface of the encapsulated housing such that a metallic material of the plurality of contact areas is recessed in the encapsulated housing.

12. Device according to claim 1, wherein the integrated control chip comprises a memory for storing correction factors for at least the at least one optoelectronic component integrated in the radiation area, and the integrated control chip is adapted for setting a current through the at least one optoelectronic component integrated in the radiation area corrected with the correction factors.

13. Device according to claim 12, wherein the correction factors comprises at least one of the following dependencies:

a sensed temperature;

a temperature difference between two positions;

compensation for component aging as a function of operating time; and correction of differences in brightness of the various optoelectronic components.

14. Light emitting arrangement comprising:

an optoelectronic device including:

an encapsulated housing having a radiation area;

a control chip integrated in the encapsulated housing;

at least one optoelectronic component integrated in the radiation area and coupled to the integrated control chip for electrical actuation;

a plurality of contact areas on at least one side of the encapsulated housing electrically connected at least in part to the integrated control chip;

wherein at least a first and a second contact areas of said plurality of contact areas each being electrically connected to said integrated control chip and adapted to be electrically connected to an optoelectronic component disposed outside of said housing, respectively a first group of contact areas of said plurality of contact areas are adapted to receive control signals to said integrated control chip and are connected thereto; and a second group of contact areas of said plurality of contact areas is provided, said second group comprising at least one contact area for a ground connection, and a contact area for connecting a supply voltage at least to said integrated control chip;

a first external optoelectronic component connected to the first contact area of the plurality of contact areas and to a potential tap; and a second external optoelectronic component connected to the second contact area of the plurality of contact areas and to the potential tap.

15. Light arrangement according to claim 14, in which the at least one optoelectronic component integrated in the radiation area, the first external optoelectronic component and the second external optoelectronic component are designed to generate light in different colors, in particular in the colors red, green and blue.

16. Light arrangement according to claim 14, in which the first and/or the second external optoelectronic component is integrated in a housing with a radiation area, which comprises the same dimensions as the encapsulated housing.

17. Light arrangement according to claim 14, in which the housing comprises a smaller number of contact areas than the encapsulated housing, in particular no first and second contact areas and/or integrated control chip.

18. Mounting strap comprising a light arrangement according to claim 14, wherein a strap having a plurality of recesses is provided, wherein the optoelectronic device is placed in a first recess; and a housing with the first external optoelectronic component is arranged in at least one further recess adjacent to the first recess, and the housing comprises the same dimensions as the encapsulated housing of the device.

19. Mounting strap according to claim 18, wherein three successive recesses of the plurality of recesses respectively receive the device and the housings with the first external optoelectronic component and the second external optoelectronic component.

20. Mounting strap of claim 18, further comprising a marker having a defined relationship to the recess in which the device is provided.

21. An optoelectronic device comprising:

an encapsulated housing having a radiation area;

a control chip integrated in the encapsulated housing;

at least one optoelectronic component integrated in the radiation area and coupled to the integrated control chip for electrical actuation;

a plurality of contact areas on at least one side of the encapsulated housing electrically connected at least in part to the integrated control chip;

wherein:

at least a first and a second contact areas of said plurality of contact areas each being electrically connected to said integrated control chip and adapted to be electrically connected to an optoelectronic component disposed outside of said housing, respectively a first group of contact areas of said plurality of contact areas are adapted to receive control signals to said integrated control chip and are connected thereto;

a second group of contact areas of said plurality of contact areas is provided, said second group comprising at least one contact area for a ground connection, and a contact area for connecting a supply voltage at least to said integrated control chip;

the integrated control chip comprises a memory for storing correction factors for the optoelectronic components arranged outside the housing, and the integrated control chip is configured for providing a current corrected with the correction factors at the first and second contact areas of the plurality of contact areas.

* * * * *